Figure 1:
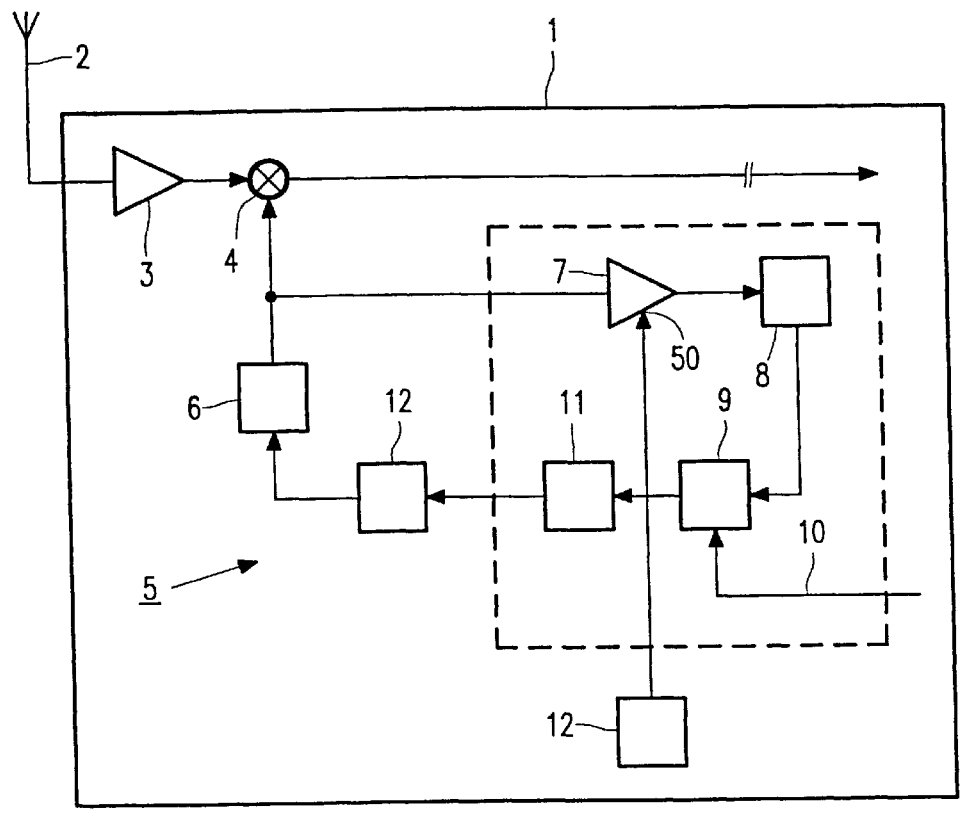

United States Patent
Wang

[19]

[11] Patent Number: 6,020,789
[45] Date of Patent: Feb. 1, 2000

[54] HIGH FREQUENCY AMPLIFIER, AND A COMMUNICATION RECEIVER OR TRANSCEIVER

[75] Inventor: Zhenhua Wang, Zürich, Switzerland

[73] Assignee: U.S. Philips Corporation, New York, N.Y.

[21] Appl. No.: 09/153,779

[22] Filed: Sep. 15, 1998

[30] Foreign Application Priority Data

Sep. 15, 1997 [EP] European Pat. Off. .............. 97202817

[51] Int. Cl.[7] .................................................. H03F 3/04
[52] U.S. Cl. ............................................. 330/311; 330/98
[58] Field of Search .................................. 330/310, 311, 330/98, 277, 51, 293; 455/260, 264

[56] References Cited

U.S. PATENT DOCUMENTS

| | | | |
|---|---|---|---|
| 3,899,746 | 8/1975 | Csicsatka | 330/22 |
| 5,280,200 | 1/1994 | Tarng | 307/446 |
| 5,491,441 | 2/1996 | Goetschel et al. | 327/291 |
| 5,745,009 | 4/1998 | Leroux et al. | 330/277 |

FOREIGN PATENT DOCUMENTS

| | | | |
|---|---|---|---|
| 229586 | 8/1960 | Australia | 330/311 |
| 374391 | 2/1964 | Switzerland | 330/311 |

OTHER PUBLICATIONS

Mullard, Transistors in Audio Amplifiers, proceedings of the I. R. E., Australia, p. 28, Jan. 1957.

Morton Cohen and Donald Arany, Subminiature Beacon, Apr. 1, 1957.

*Primary Examiner*—Benny T. Lee
*Assistant Examiner*—Henry Choe
*Attorney, Agent, or Firm*—Jack D. Slobod

[57] ABSTRACT

Known is a two stage high frequency amplifier preceded by a large amplification gain stage providing a fixed swing signal for the two stage amplifier. Particularly in portable devices such as pagers, and mobile or cordless phones, such a receiver structure consumes much power. An amplifier structure is proposed with a cascade of at least four amplifier stages, alternately resistive feedback amplifier stages and non-resistive amplifier stages. Herewith, a dramatic improvement of the gain-bandwidth product is achieved, for the same static power consumption. The amplifier can be used in a PLL of a synthesizer circuit for a pager, cellular or cordless phone, or any other suitable communication device.

8 Claims, 3 Drawing Sheets

HIGH FREQUENCY AMPLIFIER, AND A COMMUNICATION RECEIVER OR TRANSCEIVER

The present invention relates to a high frequency amplifier comprising a cascade of a resistive feedback amplifier stage and a non-resistive feedback amplifier stage.

The present invention further relates to a communication receiver or transceiver.

A high frequency amplifier of the above kind is known the U.S. Pat. No. 5,491,441. In the U.S. Pat. No. 5,391,441 an amplifier is described for amplifying an oscillator signal having an output voltage swing of a fairly small magnitude, typically 100 mV to 1 volt. A so-called translator circuit is coupled between an output of the oscillator and an input of the resistive feedback amplifier stage. The translator stage generates a large fixed swing output signal from the variable amplitude small magnitude output oscillator signal. When included in an integrated circuit, because of the large amplification factor, a transistor comprised in the translator stage has a relatively large chip area so that a relatively large supply current is needed. Particularly when used in portable devices such as a message pager, or a mobile or cordless phone, it is highly undesirable to include high current circuitry. What is needed is circuitry with as low power consumption as possible. Or, stated otherwise, the amplifier structure should be such that sufficient gain and bandwidth is obtained in an application such as described above, while at the same time the power consumption is low. In this respect, the circuit as described in the U.S. Pat. No. 5,491,441 has the further disadvantages of having a relatively low gain and bandwidth. A still further disadvantage of the known circuit is that in case of mismatches in the transistor devices of the first and second stage, the quiescent operating point of the non-resistive feedback stage could shift so much towards one of the power supply rails that the magnitude of the output signal of the amplifier would be dramatically reduced.

It is an object of the present invention to provide a high frequency amplifier, particularly for use in a frequency or phase lock loop of a frequency synthesizer, which has a sufficiently large gain and bandwidth, while at the same time the power consumption is low.

To this end the high frequency amplifier according to the present invention is characterised in that the cascade comprises at least one further resistive feedback amplifier stage and at least one further non-resistive feedback amplifier stage, the succession of resistive and non-resistive feedback amplifier stages in the cascade being such the resistive and non-resistive amplifier stages are alternately configured in the cascade.

The invention is based upon the insight that power consumption can be reduced by a succession of a sufficient number of equal basic building blocks comprised of a resistive feedback amplifier stage coupled to a non-resistive amplifier stage. Because the chip area per stage can be made small, the power consumption is low. A sufficient number of stages achieves a large gain and band-width. It was realised that another possible solution could be cascading of a large number of resistive or non-resistive feedback amplifier stages, respectively. Simulation results, however, showed that coupling resistive feedback amplifier stages resulted in sufficient gain at low frequencies, but resulted in a rapid voltage drop at higher frequencies so that for small input signal the amplifier would not operate correctly at higher frequencies. Also, coupling of non-resistive feedback amplifiers did not give satisfactory simulation results.

Embodiments are claimed in the dependent claims. An even number of stages achieves that the polarities of the input and output signals of the amplifier are the same. With identical amplifier stages maximum bandwidth is achieved, and further ease of design. AC-coupling of amplifier stages is applied if the DC-offset per stage is not well-defined. By applying power supply enabling transistors in each amplifier stage, it is achieved that the amplifier can be shut down completely. This is of great importance when applying the amplifier in a portable communication receiver or transceiver because power consumption should be reduced to minimum when a circuit is temporarily not operational. Such an temporarily not operational state occurs frequently in paging receivers or in FD/TDMA GSM transceivers.

Figure 2:
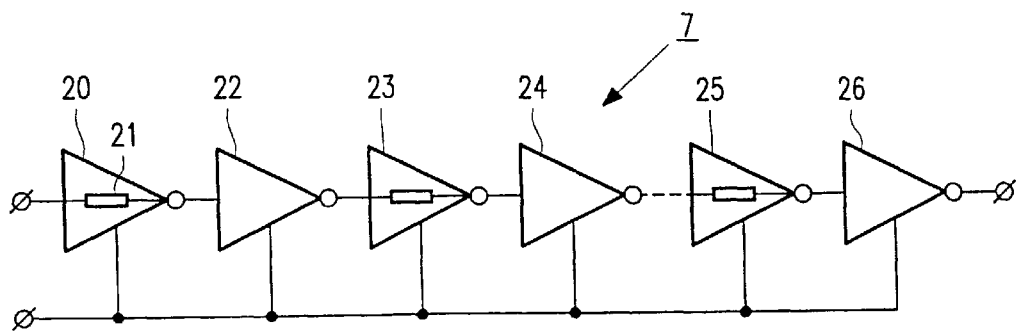
Figure 3:
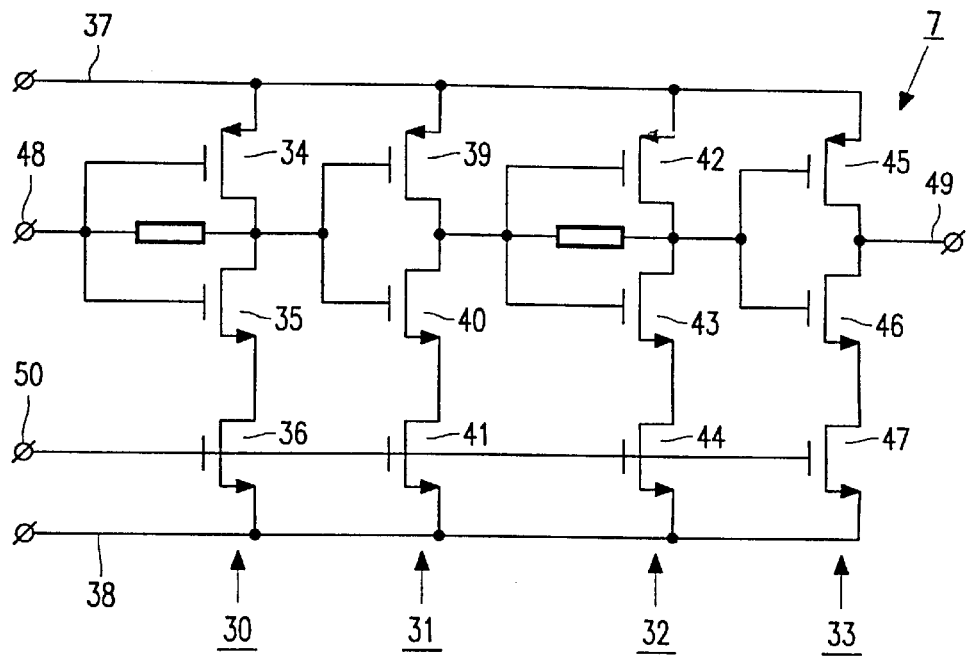
Figure 4:
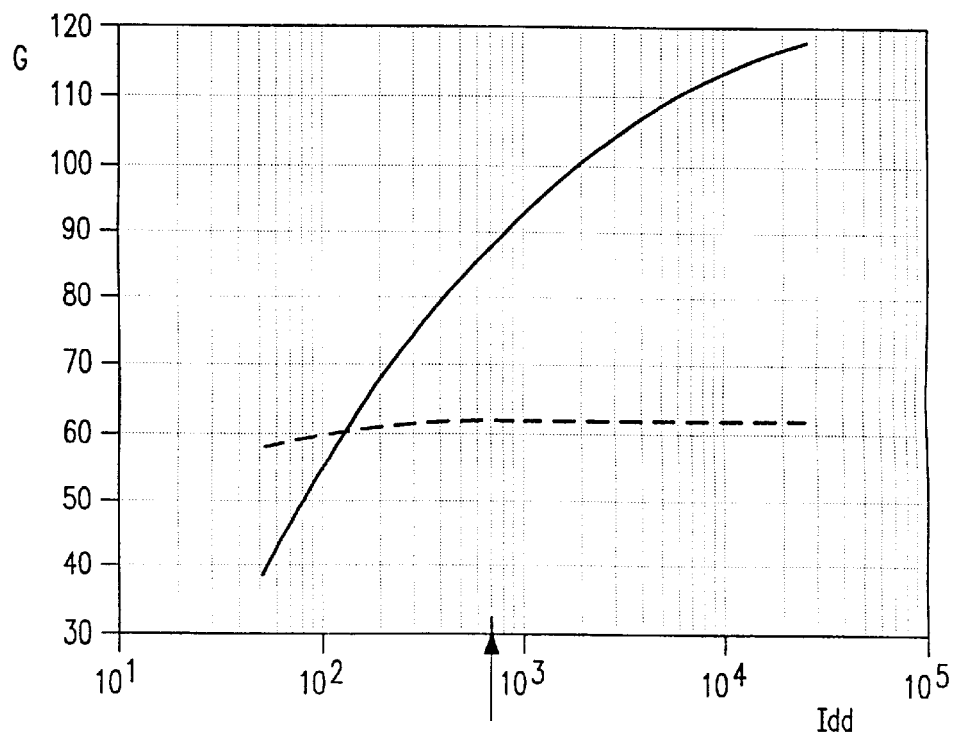
Figure 5:
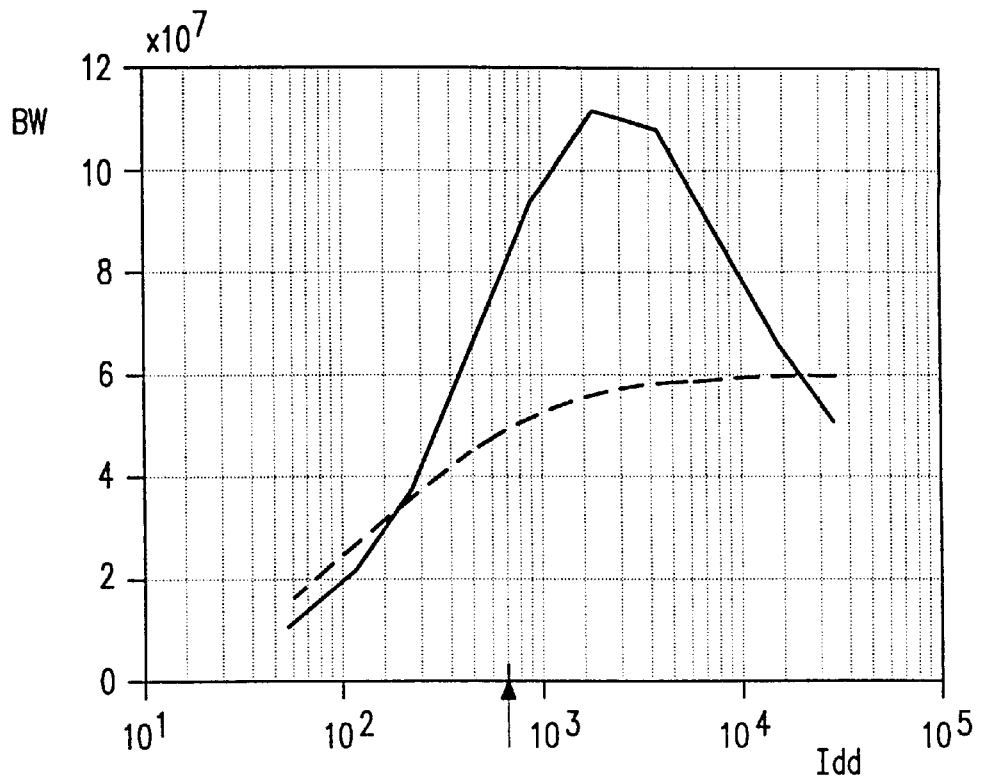
Figure 6:
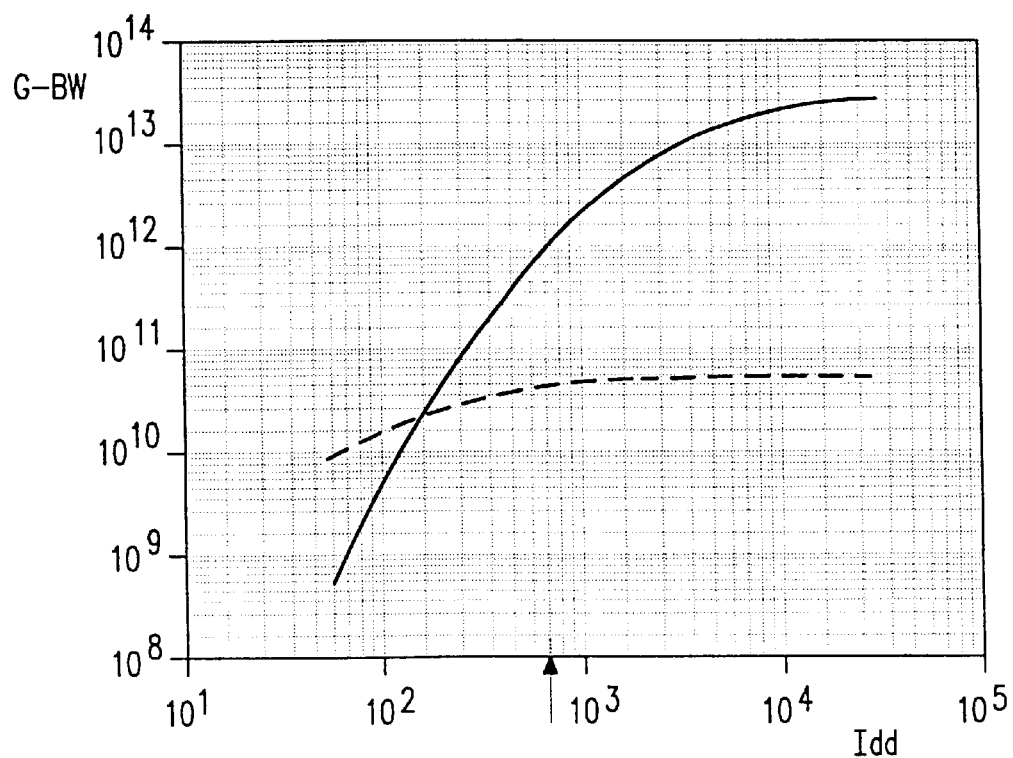

The present invention will now be described, by way of example, with reference to the accompanying drawings, wherein FIG. 1 schematically shows a communication receiver according to the present invention, FIG. 2 shows a block diagram of a high frequency amplifier according to the present invention, FIG. 3 shows an embodiment of a high frequency amplifier according to the present invention, FIG. 4 shows simulation results for the gain of the amplifier as compared with prior art, FIG. 5 shows simulation results for the bandwidth of the amplifier as compared with the prior art, and FIG. 6 shows simulation results for the gain-bandwidth of the amplifier as compared with the prior art.

Throughout the figures the same reference numerals are used for the same features.

FIG. 1 schematically shows a communication receiver 1 according to the present invention. Such a communication receiver can be a message pager. When the receiver is included in the receiver branch of a transceiver further having a transmitter branch (not shown), a transceiver for use in a cellular system such as GSM or in a cordless system such as DECT is obtained. The receiver 1 comprises an antenna 2 coupled to an RF-amplifier 3 of which an output signal is fed to a mixer 4. An output signal of the mixer 4 is fed to usual circuitry such as a second mixer, if the case may be, and a demodulator, and baseband circuitry. Such circuitry is well-known in the art and thus not shown in detail here. The receiver 1 comprises local frequency generating means 5, of which an output signal is fed to the mixer 4. The frequency generating means 5 comprises a voltage controlled oscillator 6 included in a frequency or phase lock frequency control loop comprising an amplifier 7 according to the present invention, a dual modulus prescaler 8, a phase detector 9 to which a reference oscillator signal 10 is fed, a charge pump 1 1, and a loop filter 12. The receiver 1 further comprises a microcontroller 12 which controls the amplifier 7, inter alia.

FIG. 2 shows a block diagram of the high frequency amplifier 7 according to the present invention. The amplifier 7 comprises at least four amplifier stages. Shown is a 6 stage embodiment with a dashed connection line between the fourth and fifth stage. With the dashed line, it is indicated that the amplifier can be extended to any desired number of stages. The amplifier 7 comprises a resistive feedback amplifier stage 20. Resistive feedback is shown symbolically with a resistor 21 in the amplifier symbol. The stage 20 is succeeded by a non-resistive feedback amplifier stage 22. The shown cascade further comprises the same successive structure of amplifier stage building blocks. Shown are amplifiers 23, 24, 25, and 26.

FIG. 3 shows a four stage embodiment of the high frequency amplifier 7 according to the present invention having respective amplifier stages 30, 31, 32, and 33. The stages 30 and 32 are resistive feedback amplifier stages, and the stages 31 and 33 are non-resistive feedback stages. The amplifier stage 30 comprises a series arrangement of CMOS transistors 34, 35, and 36, between supply rails 37 and 38. Similarly, the stages 31, 32, and 33 comprise CMOS transistors 39, 40, 41, 42, 43, 44, 45, 46, and 47. The amplifier 7 comprises an input terminal 48 and an output terminal 49, and further an enable input 50 for enabling power supply to the stages. The transistors 36, 41, 44, and 47 are power supply enabling transistors controlled by the microcontroller 12. The transistors 36, 41, 44, and 47 can also be PMOS transistors. In that case, these transistors are put between the supply rail 37 and the transistors 34, 39, 42, and 45 of the amplifier stages.

FIG. 4 shows simulation results for the gain of the four stage amplifier 7 as compared with the prior art document, the U.S. Pat. No. 5,491,441. Similar circumstances were taken, i.e., the same chip area for the transistors and thus the same quiescent current Idd, the same load, and the same input coupling capacitor. The selected process was a 0.35 μm CMOS process. The supply voltage was chosen 2 volts. The simulation was done at a simulated room temperature. The gain G is shown on the vertical axis, in dB. The current Idd is shown in μA. The solid line curve shows the simulation results of the amplifier 7 according to the present invention, and the dashed line shows the simulation results of the prior art circuit. The simulation results show a dramatic improvement of the amplifier according to the invention over the prior art amplifier. E.g., for a typical Idd current of 700 μA, the improvement is at about 24 dB.

FIG. 5 shows simulation results for the bandwidth BW, in Hz, of the amplifier 7 as a function of Idd, as compared with the prior art, the U.S. Pat. No. 5,491,441. Also here, a dramatic improvement over the prior art is obtained. For Idd=700 μA, the improvement is above 30 Mhz.

FIG. 6 shows simulation results for the gain-bandwidth G-BW of the amplifier 7 as compared with the prior art, the U.S. Pat. No. 5,491,441. From the simulation results it is thus very clear that a higher gain and a wider bandwidth do not necessarily mean that a higher power consumption is needed such as with prior art circuits. With prior art circuits, usually a further amplifier external to the IC is needed as a pre-amplifier. With such an external amplifier, power consumption strongly increases, and also production costs of a device including the external amplifier increase. A further advantage of leaving out an external amplifier is that the communication device can be made smaller in size and lower in weight.

In view of the foregoing it will be evident to a person skilled in the art that various modifications may be made within the spirit and the scope of the present invention as hereinafter defined by the appended claims and that the present invention is thus not limited to the examples provided.

I claim:

1. A high frequency amplifier comprising a cascade of a resistive feedback amplifier stage and a non-resistive feedback amplifier stage, characterised in that the cascade comprises at least one further resistive feedback amplifier stage and at least one further non-resistive feedback amplifier stage, the succession of resistive and non-resistive feedback amplifier stages in the cascade being such that the resistive and non-resistive amplifier stages are alternately configured in the cascade.

2. A high frequency amplifier as claimed in claim 1, wherein the number of resistive feedback amplifier stages is equal to the number of non-resistive feedback amplifier stages.

3. A high frequency amplifier as claimed in claim 1, wherein the amplifier stages are DC-coupled.

4. A high frequency amplifier as claimed in claim 1, wherein the amplifier stages are AC-coupled.

5. A high frequency amplifier as claimed in claim 1, wherein the amplifier is included in an integrated circuit, and all said amplifier stages comprise CMOS transistors, the chip areas of corresponding CMOS transistors in successive stages being substantially equal.

6. A high frequency amplifier as claimed in claim 1, wherein all said amplifier stages comprise power supply enabling transistors with coupled control inputs.

7. A communication receiver or transceiver comprising an antenna and high frequency processing means, which comprises said high frequency amplifier as claimed in claim 1.

8. A communication receiver or transceiver as claimed in claim 7, wherein the high frequency processing means comprises a radio frequency amplifier coupled between the antenna and a mixer, and a frequency synthesizer coupled to the mixer, which frequency synthesizer comprises a voltage controlled oscillator included in a frequency control loop, the high frequency amplifier being included in the frequency control loop and being coupled to an output of the voltage controlled oscillator.

\* \* \* \* \*